United States Patent
Yen et al.

(10) Patent No.: US 8,841,721 B2
(45) Date of Patent: Sep. 23, 2014

(54) STEPPED TRENCH MOSFET AND METHOD OF FABRICATING THE SAME

(71) Applicant: Industrial Technology Research Institute, Hsinchu (TW)

(72) Inventors: Cheng-Tyng Yen, Kaohsiung (TW); Chien-Chung Hung, Hsinchu (TW); Young-Shying Chen, Hsinchu (TW); Chwan-Ying Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/888,392

(22) Filed: May 7, 2013

(65) Prior Publication Data
US 2014/0167151 A1  Jun. 19, 2014

(30) Foreign Application Priority Data

Dec. 19, 2012 (TW) .............................. 101148427 A

(51) Int. Cl.
- H01L 29/76 (2006.01)
- H01L 29/78 (2006.01)
- H01L 29/66 (2006.01)

(52) U.S. Cl.
CPC ...... *H01L 29/7827* (2013.01); *H01L 29/66666* (2013.01)
USPC ........................................................ 257/330

(58) Field of Classification Search
USPC .................. 257/401, 330, 288, 341
See application file for complete search history.

(56) References Cited

U.S. PATENT DOCUMENTS

| | | | |
|---|---|---|---|
| 5,506,421 A | 4/1996 | Palmour | |
| 5,614,749 A | 3/1997 | Ueno | |
| 5,661,312 A | 8/1997 | Weitzel et al. | |
| 5,719,409 A | 2/1998 | Singh et al. | |
| 6,359,308 B1 * | 3/2002 | Hijzen et al. | 257/341 |
| 6,600,193 B2 | 7/2003 | Darwish | |
| 6,710,403 B2 * | 3/2004 | Sapp | 257/330 |
| 7,033,892 B2 | 4/2006 | Hsu et al. | |
| 7,196,374 B1 * | 3/2007 | Lin et al. | 257/327 |

(Continued)

FOREIGN PATENT DOCUMENTS

TW  201013936  4/2010

OTHER PUBLICATIONS

T. Nakamura et al., "High Performance SiC Trench Devices with Ultra-low Ron," Electron Devices Meeting (IEDM), IEEE International, Dec. 5-7, 2011, pp. 26.5.1-26.5.3.

(Continued)

*Primary Examiner* — Thao P Le
(74) *Attorney, Agent, or Firm* — Jianq Chyun IP Office

(57) ABSTRACT

A step trench metal-oxide-semiconductor field-effect transistor comprises a drift layer, a first semiconductor region, a stepped gate and a floating region. The drift layer is of a first conductivity type. The first semiconductor region is of a second conductivity type and located on the drift layer, wherein the drift layer and the first semiconductor region have a stepped gate trench therein. The stepped gate trench at least comprises a first recess located in the first semiconductor region and extending into the drift layer and a second recess located below a bottom of the first recess, wherein a width of the second recess is smaller than a width of the first recess. A floating region is of the second conductivity type and located in the drift layer below the second recess.

20 Claims, 16 Drawing Sheets

(56) References Cited

U.S. PATENT DOCUMENTS

| | | |
|---|---|---|
| 7,470,953 B2 | 12/2008 | Takaya et al. |
| 7,476,931 B2 | 1/2009 | Schmidt |
| 7,825,449 B2 | 11/2010 | Suzuki et al. |
| 7,994,513 B2 | 8/2011 | Yamamoto et al. |
| 8,084,327 B2 | 12/2011 | Sapp |
| 8,097,916 B2 | 1/2012 | Poelzl |
| 8,252,647 B2 * | 8/2012 | Lee et al. ............ 438/270 |
| 2004/0132256 A1 * | 7/2004 | Kim et al. ............ 438/296 |
| 2006/0289928 A1 | 12/2006 | Takaya et al. |
| 2007/0221965 A1 * | 9/2007 | Miller et al. ............ 257/288 |
| 2009/0114969 A1 | 5/2009 | Suzuki et al. |
| 2009/0166686 A1 * | 7/2009 | Hunt et al. ............ 257/288 |
| 2010/0163847 A1 * | 7/2010 | Majhi et al. ............ 257/24 |

OTHER PUBLICATIONS

M. Uchida et al., "Novel SiC Power MOSFET with Integrated Unipolar Internal Inverse MOS-Channel Diode," Electron Devices Meeting (IEDM), IEEE International, Dec. 5-7, 2011, 26.6.1-26.6.4.

Ljubisa D. Stevanovic et al., "Recent Advances in Silicon Carbide MOSFET Power Devices," Applied Power Electronics Conference and Exposition (APEC), Twenty-Fifth Annual IEEE, Feb. 21-25, 2010, pp. 401-407.

Shinsuke Harada et al., "4.3 mΩcm2, 1100V4H-SiC Implantation and Epitaxial MOSFET," Materials Science Forum vols. 527-529, Oct. 15, 2006, pp. 1281-1284.

Shinsuke Harada et al., "8.5-mΩ•cm2 600-V Double-Epitaxial MOSFETs in 4H-SiC," Electron Device Letters, IEEE vol. 25 Issue 5, May 2004, pp. 292-294.

* cited by examiner

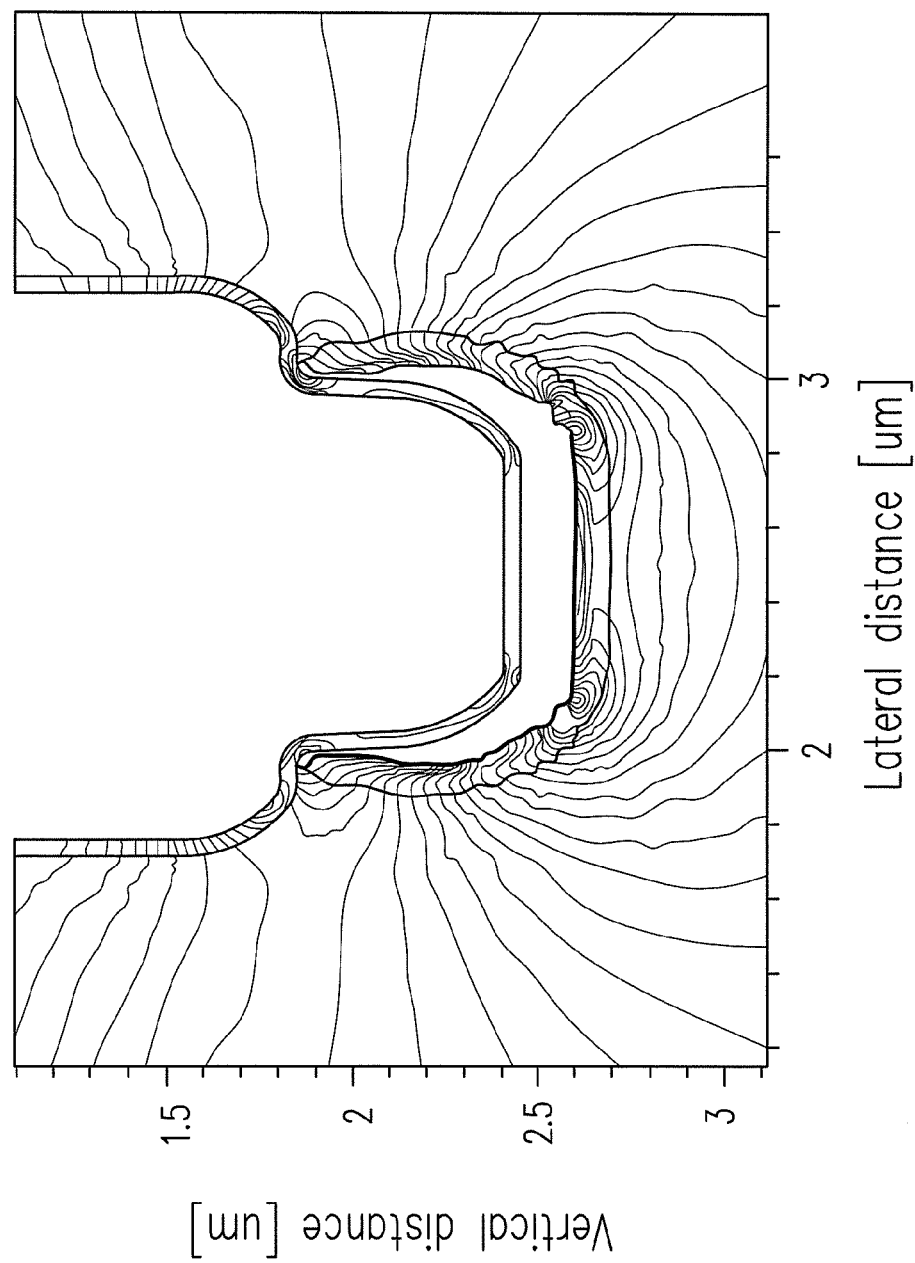

US 8,841,721 B2

STEPPED TRENCH MOSFET AND METHOD OF FABRICATING THE SAME

CROSS-REFERENCE TO RELATED APPLICATION

This application claims the priority benefit of Taiwan application serial no. 101148427, filed on Dec. 19, 2012. The entirety of the above-mentioned patent application is hereby incorporated by reference herein and made a part of this specification.

BACKGROUND

1. Technical Field

The technical field relates to a stepped trench metal oxide semiconductor field effect transistor (MOSFET) and a method of fabricating the same.

2. Background

In order to meet the requirements for new generation electronic products and electric power systems, the role played by power devices becomes more and more important. In the applications of green energy industries, such as electric vehicle (EV)/hybrid electric vehicle (HEV), distributed power and smart grids, wind power and photovoltaic (PV) systems, power consumptions and conversion efficiencies of power devices are the keys of conserving energy.

Currently, most applications use Si-based devices such as Si Schottky barrier diode (SBD), Si-MOSFET and Si insulated-gate bipolar transistor (IGBT) etc. However, these Si-based devices have relatively high thermal resistivity and thus particular attention has to be paid for heat dissipation. Cooling modules for these devices usually occupy relatively large space in power systems. Such devices also have relatively large turn-on and switching loss.

SUMMARY

One of exemplary embodiments comprises a stepped trench MOSFET, which comprises a drift layer of a first conductivity type, a first semiconductor region of a second conductivity type, a second semiconductor region of the first conductivity type, a stepped gate, a floating region of the second conductivity type, an insulation layer and a source region of the first conductivity type. The first semiconductor region is disposed on a first surface of the drift layer. The stepped gate trench is disposed in the drift layer and in the first semiconductor region. The stepped gate trench at least comprises a first recess and a second recess, the first recess is located in the first semiconductor region and extends into the drift layer, the second recess is located in the drift layer below the bottom of the first recess. The width of the second recess is smaller than that of the first recess. The second semiconductor region is disposed on a second surface of the drift layer. The stepped gate is disposed in the stepped gate trench. The floating region is disposed in the drift layer below the bottom of the second recess. The insulation layer is disposed in the stepped gate trench and insulates the stepped gate from each of the first semiconductor region, the drift layer and the floating region. The source region is disposed in the first semiconductor region adjacent to the sidewall of the stepped gate trench. A current conducting channel is formed in the first semiconductor region when a gate voltage (Vds) greater than the threshold voltage (Vth) is applied, along the sidewall of the stepped gate trench and between the source region and the drift layer.

One of exemplary embodiments comprises a method of fabricating a stepped trench MOSFET. A first semiconductor region of a second conductivity type is formed on a drift layer of a first conductivity type, wherein the drift layer is disposed on a second semiconductor region of the first conductivity type. A stepped gate trench is formed in the drift layer and in the first semiconductor region, wherein the stepped gate trench at least comprises a first recess and a second recess, the first recess is located in the first semiconductor region and extends into the drift layer, the second recess is located in the drift layer below a bottom of the first recess. The width of the second recess is smaller than that of the first recess. A source region of the first conductivity type is formed in the first semiconductor region at the sidewall of the stepped gate trench. When a gate voltage greater than a threshold voltage is applied, a current conducting channel is formed in the first semiconductor region, along the sidewall of the stepped gate trench and between the source region and the drift layer. A floating region of the second conductivity type is formed in the drift layer below the bottom of the second recess. An insulation layer is formed in the stepped gate trench. A stepped gate is formed in the stepped gate trench, wherein the insulation layer insulates the stepped gate from each of the first semiconductor region, the drift layer and the floating region.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 4A is a diagram illustrating the electric field distribution of a stepped trench MOSFET having double recesses with a p-type floating region of Example 1 of the disclosure.

DETAILED DESCRIPTION OF DISCLOSED EMBODIMENTS

Figure 1A:
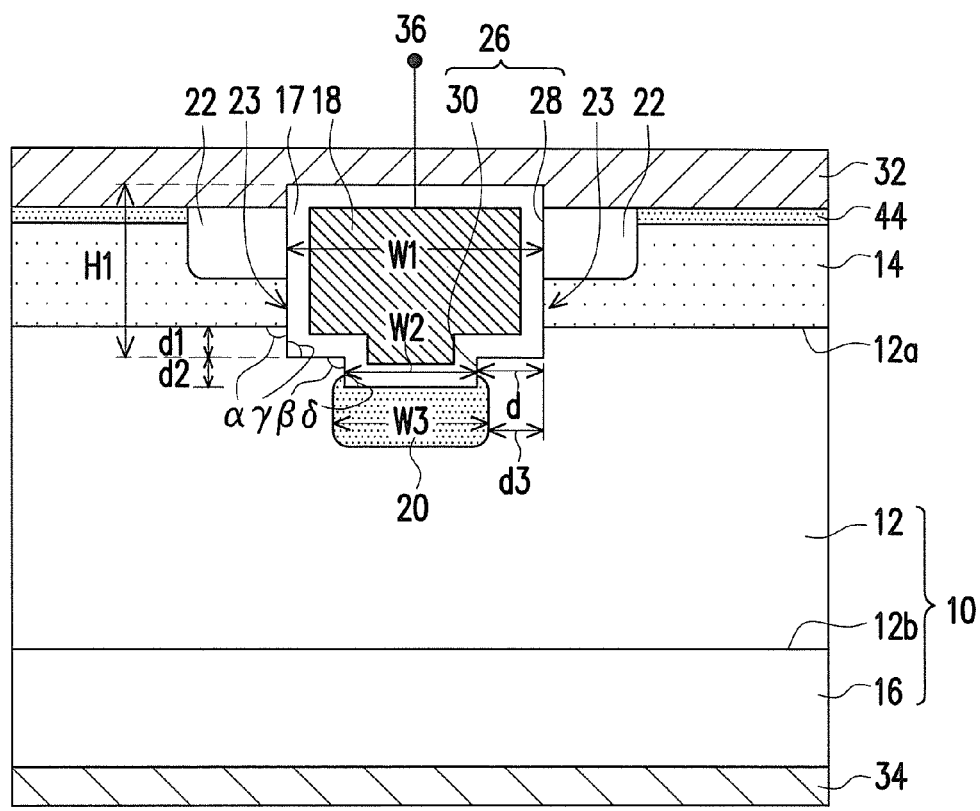
FIG. 1A to FIG. 1E each is a cross-sectional view of a stepped trench MOSFET according to an exemplary embodiment.

Wide bandgap (WBG) materials such as silicon carbide (SiC) have a high thermal conductivity three times as big as of silicon, which enables harsh environments applications of WBG devices and is also helpful to reduce the size and weight of modules and systems using these devices. In addition, because of the high critical breakdown field and the lower intrinsic carrier concentration of silicon carbide, SiC devices have characteristics of high blocking voltage, low leakage current and fast responses, which can provide low on-state and switching losses. Generally, saving half of power consumed by the system can be expected by replacing Si devices with SiC devices.

There are many switches and diodes in medium-to-high power applications such as motor drivers of EV/HEV and inverters of PV and smart grids. The common voltage ratings of these devices are 600V, 1,200V and 1,700V. The hybrid module combining Si-IGBT and SiC Schottky diode are now replacing traditional modules containing only Si devices, to reduce the power consumption and the volume of modules. However, bipolar devices such as Si-IGBT encounter the injection of minority carriers which will result in a higher switching loss and a lower switching frequency than unipolar devices such as SiC MOSFET. Therefore, it is desirable to replace bipolar devices with unipolar devices for reducing switching losses and improving switching speeds. However, the turn-on characteristics (turn on resistance) of SiC-DMOSFET is not as good as that of bipolar Si-IGBT devices. Therefore, it is desirable to further improve the turn on resistance (Rds(on)) of SiC MOSFET to attain the widespread use of SiC technology in commercial power products.

In the stepped trench MOSFET of the disclosure, with a bottom drain region and a top source region, the turn on current flows vertically to accommodate high power density. The DMOS has a lateral channel which is controlled by the gate disposed on it. The vertical channel provided at the sidewall of stepped trenches of the disclosure and controlled by the gate disposed in the trenches can increase the channel density so as to reduce the turn on resistance.

Generally, when the vertical channel is used to replace the lateral channel, the resistance can be reduced to ¼ to ⅐ of its original value. Therefore, the energy consumption and product cost for the whole power system can be greatly improved. However, the electric field of trench MOSFET at the trench bottoms and corners is extremely high (can be as high as 15 MV/cm) and is beyond the dielectric strength of gate dielectric. In the stepped trench MOSFET of the disclosure, a gate is formed in the stepped gate trench with different widths of recesses. Moreover, a floating region is formed below the bottom of the narrower and deeper recess, so that a depletion region formed because of the pn junction between the floating region and the drift region can be used to shield the electric field of the gate dielectric layer and increase the device reliability during the reverse operation. In addition, the floating region below the bottom of the narrower and deeper recess will not affect the turn on resistance Rds(on) during the forward operation because the channel is formed along the sidewall of the wider and shallower recess.

In the following, the stepped trench MOSFET of the disclosure is illustrated with reference to the accompanying drawings.

FIG. 1A to FIG. 1E each schematically illustrate a cross-sectional view of a stepped trench MOSFET according to an exemplary embodiment.

Referring to FIG. 1A, the stepped trench MOSFET of the disclosure comprises a drift layer 12, a first semiconductor region 14, a second semiconductor region 16, a stepped gate 18, a floating region 20 and a source region 22. The stepped trench MOSFET can further comprise a first conductive layer 32, a second conductive layer 34 and a third conductive layer 36.

The drift layer 12 has a first conductivity type. In this embodiment, the first conductivity type is n-type. The first surface 12a of the drift layer 12 contacts the first semiconductor region 14, and the second surface 12b of the drift layer 12 contacts the second semiconductor region 16. The thickness and concentration of the drift layer 12 depend on the desired rated power. In an embodiment, when the target rated voltage is 1,200 V, the drift layer 12 has a thickness of 11 μm and a doping concentration of $6 \times 10^{15}$ cm$^{-3}$. The drift layer 12 comprises a semiconductor or a compound semiconductor. In this embodiment, the drift layer 12 can comprise 4H—SiC.

The first semiconductor region 14 has a second conductivity type and is disposed on and in contact with the first surface 12a of the drift layer 12. The first semiconductor region 14 serves as a body region. A first doped region 44 having the second conductivity type and a high doping concentration can be further formed at the surface of the first semiconductor region 14 so as to create a good body contact. In this embodiment, the second conductivity type is p-type, and the first doped region 44 is a p+ (heavily doped p-type) region. The thickness and concentration of the first semiconductor region 14 depend on the desired rated power and the concentration of the drift later 16. In an embodiment, the first semiconductor region 14 has a thickness of 1.5 μm and a p-type doping concentration of $6 \times 10^{16}$ cm$^{-3}$. The first doped region 44 has a surface doping concentration of greater than $1 \times 10^{19}$ cm$^{-3}$. The first semiconductor region 14 can be an epitaxial layer. The first semiconductor region 14 comprises a semiconductor or a compound semiconductor. In this embodiment, the first semiconductor region 14 can comprise p-type 4H—SiC.

The second semiconductor region 16 has the first conductivity type and is disposed on and in contact with the second surface 12b of the drift layer 12. The second semiconductor region 16 serves as a drain region. The second semiconductor region 16 comprises a semiconductor or a compound semiconductor. In this embodiment, the second semiconductor region 16 comprises n+ (heavily doped n-type) SiC. In this embodiment, the second semiconductor region 16 has an n-type doping concentration higher than that of the drift layer 12. In an embodiment, the second semiconductor layer 16 can be a 4H—SiC substrate having an n-type doping concentration of greater than $1 \times 10^{19}$ cm$^{-3}$, the drift layer 12 with aforementioned thickness and doping concentration is grown on the second semiconductor layer 16. A buffer layer (not shown) with a doping concentration varying from the doping concentration of the second semiconductor layer 16 to the doping concentration of the drift layer 12 can be formed on the second semiconductor layer 16 before the drift layer 12 to reduce epitaxial defects.

The source region 22 has the first conductivity type and is disposed in the first semiconductor region 14 adjacent to the sidewall of the stepped gate trench 26. When a gate voltage Vds is greater than a threshold voltage Vth, a channel 23 is formed in the first semiconductor region 14, along the sidewall of the stepped gate trench 26 and between the source region 22 and the drift layer 12. In this embodiment, the source region 22 is an n-type doped region having an n-type doping concentration greater than that of the drift layer 12. In an embodiment, the source region 22 has an n-type doping concentration of greater than $1 \times 10^{19}$ cm$^{-3}$, for example.

Figure 1B:
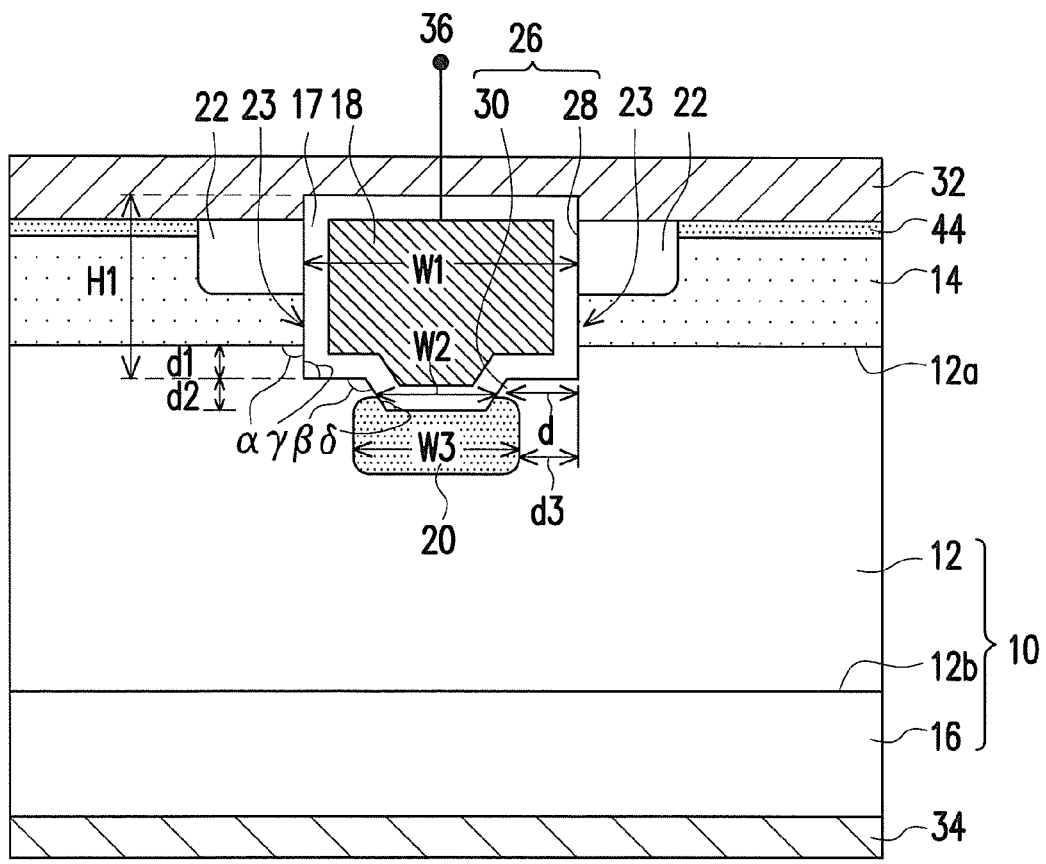
Figure 1C:
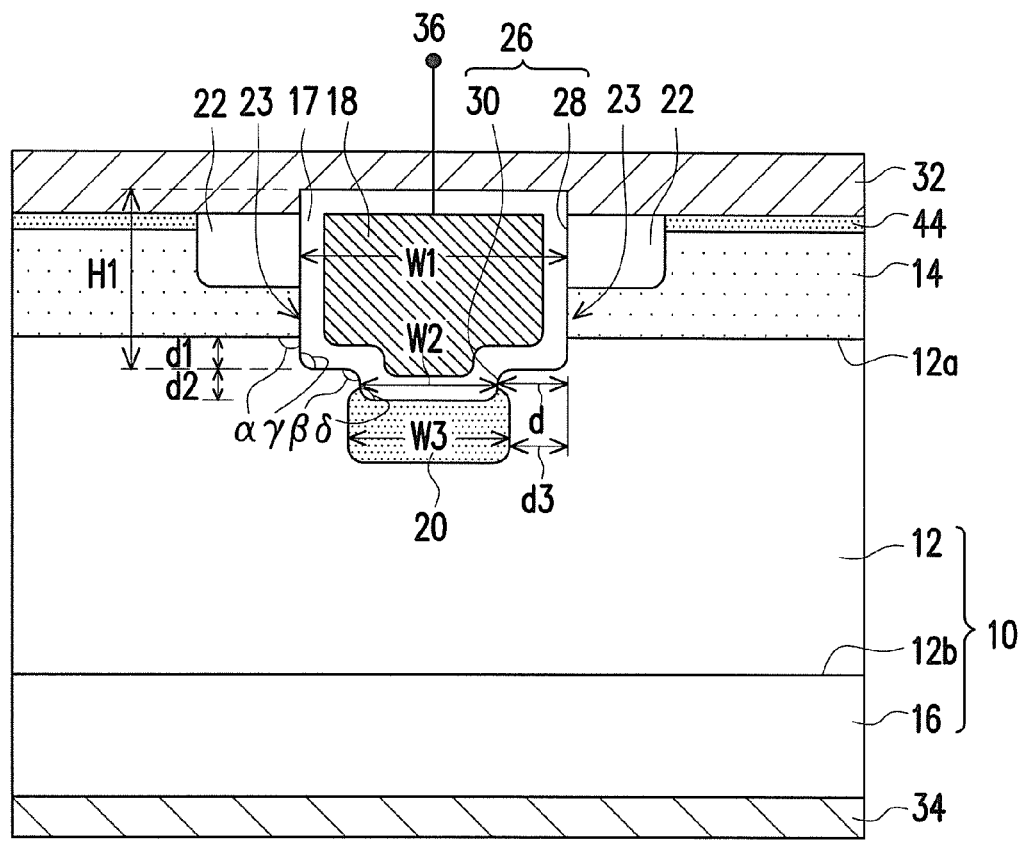

A stepped gate trench 26 is located in the drift layer 12 and in the first semiconductor region 14. The stepped gate trench 26 at least comprises a first recess 28 and a second recess 30. The first recess 28 is located in the first semiconductor region 14 and extends into the drift layer 12, the second recess 30 is located in the drift layer 12 below the bottom of the first recess 28, and the width W2 of the second recess 30 is smaller than the width W1 of the first recess 28. The widths of the first and second recesses 28 and 30 depend on the thicknesses and concentrations of the drift layer 12 and the first semiconductor region 14 designed for the given rated power. The width difference between the first and second recesses 28 and 30 is defined as the equation d=(W1−W2)/2. In an embodiment, the width difference d between the first and second recesses 28 and 30 is 0.1 μm to 0.5 μm. In an embodiment, the width W1 of the first recess 28 can be 1.6 μm, the depth H1 of the first recess 28 can be 1.8 μm, and the distance d1 from the bottom of the first recess 28 to the first surface 12a of the drift layer 12 can be 0.3 μm. The width W2 of the second recess 30 can be 1 μm, and the depth d2 of the second recess 30 can be 0.6 μm. An included angle α is defined as the angle between the sidewall of the first recess 28 and the first surface 12a of the drift layer 12, an included angle β is defined as the angle between the sidewall of the second recess 30 and the bottom surface of the first recess 28, an angle γ of the bottom corner of the first recess 28 is defined as the angle between the sidewall and bottom surface of the first recess 28, and an angle δ of the bottom corner of the second recess 30 is defined as the angle between the sidewall and bottom surface of the second recess 30. For example, each of α and β is not less than 45 degrees and is not more than 135 degrees. In the embodiment of FIG. 1A, both α and β are about 90 degrees, but the disclosure is not limited thereto. Referring to FIG. 1B, in an embodiment, the first recess 28 is a vertical sidewall opening, and each of α and γ is about 90 degrees. The second recess 30 is an opening with a wide top and a narrow bottom, and each of β and γ is greater than 90 degrees and is not more than 135 degrees. In addition, both the bottom corner of the first recess 28 and the bottom corner of the second recess 30 can be rounded, as shown in FIG. 1C.

Continue referring to FIG. 1A, the stepped gate 18 is disposed in the stepped gate trench 26. The stepped gate 18 comprises a conductive material, such as metal, alloy, n-type doped polysilicon, p-type doped polysilicon, metal silicide or a combination thereof. The said metal comprises Ni, Ti, Mo, Al, Pd or Pt etc. The said alloy can be TiW, NiTi, TiN or MoN etc. The said metal silicide comprises metal silicide formed from the said metal or alloy upon appropriate heating treatments.

Figure 1D:
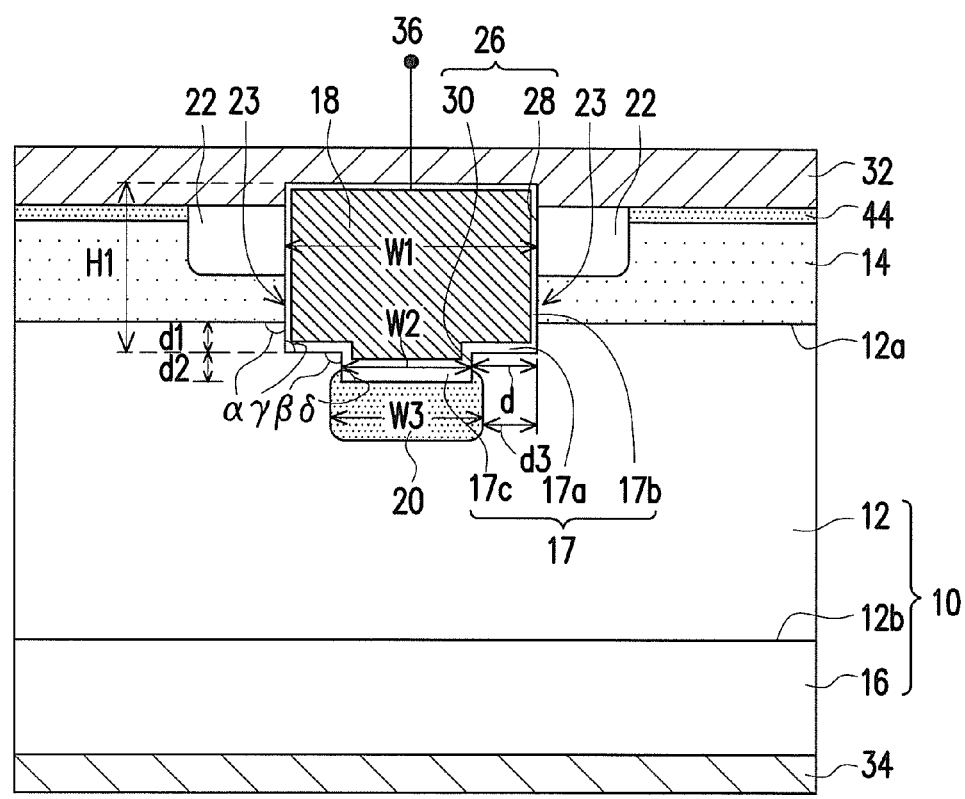

Continue referring to FIG. 1A, the insulation layer 17 functioning as a gate dielectric layer is disposed in the stepped gate trench 26 and insulates the stepped gate 18 from each of the first semiconductor region 14, the drift layer 12, the floating region 20 and the first conductive layer 32 The insulation layer 17 comprises a common gate dielectric material or a high-k material. The common gate dielectric material comprises silicon oxide or silicon oxynitirde. The high-k material is a dielectric material with a dielectric constant greater than 4, such as $HfO_2$, HfAlO, $HfW_2$, $Al_2O_3$ or $Si_3N_4$. In FIG. 1A, the thickness of the insulation layer 17 in the first recess 28 is the same as that in the second recess 30. However, the disclosure is not limited thereto. The thickness of the insulation layer 17 in the first recess 28 can be different from that in the second recess 30. Referring to FIG. 1D, in an embodiment, the insulation layer 17a on the bottom of the first recess 28 is thicker than the insulation layer 17b on the sidewall of the first recess 28. The insulation layer 17c in the second recess 30 is thicker than or as thick as the insulation layer 17a on the bottom of the first recess 28.

Continue referring to FIG. 1A, the floating region 20 has the second conductivity type. In this embodiment, the second conductivity type is p-type. The floating region 20 is disposed in the drift layer 12 at least below the bottom of the second recess 30. In an embodiment (not shown), the floating region 20 is disposed in the drift layer 12 below the bottom of the second recess 30 without extending to a portion of the sidewall of the second recess 30 and exposes the bottom corner of the second recess 30. In another embodiment, the floating region 20 is disposed in the drift layer 12 below the bottom of the second recess 30 and extends to a portion of the sidewall of the second recess 30 to cover the bottom corner of the second recess 30. The width W3 of the floating region 20 is greater than the width W2 of the second recess 30. The lateral profile of the floating region 20 does not extend to the region below the channel 23. In an embodiment, the minimum lateral distance d3, from the boundary of pn junction formed between the floating region 20 and the drift layer 12 to the sidewall of the first recess 28 is 0.1 μm, for example. In this embodiment, the floating region 20 has a doping concentration of greater than $1 \times 10^{18}$ cm$^{-3}$, for example. In FIG. 1A, the stepped gate trench 26 exemplarily comprises a first recess 28 and a second recess 30, but the disclosure is not limited thereto. In another embodiment, the stepped gate trench 26 can comprise three or more recesses with different widths arranged vertically.

Continue referring to FIG. 1A, the first conductive layer 32 is disposed on the first semiconductor region 14 and electrically connected to the source region 22. The first conductive layer 32 serves as a source contact metal layer, and an Ohmic contact is formed between the first conductive layer 32 and the first semiconductor region 14. An isolation layer (not shown) of an insulation material can be formed between the first conductive layer 32 and the first semiconductor region 14, and the first conductive layer 32 can be electrically connected to the source region 22 through a contact plug, so as to provide a good gate-source isolation. In an embodiment, the isolation layer can be a silicon oxide layer having a thickness of 1 μm. The second conductive layer 34 is disposed on a surface of the second semiconductor region 16. The second conductive layer 34 serves as a drain contact metal layer and an Ohmic contact is formed between the second conductive layer 34 and the second semiconductor region 16 (i.e. drain region). The second semiconductor region 16 is located between the drift layer 12 and the second conductive layer 34. The third conductive layer 36 is electrically connected to the stepped gate 18. Each of the first, second and third conductive layers 32, 34 and 36 can comprise metal, alloy or metal silicide, or a combination thereof, such as Al, Al alloy, TiW alloy or nickel silicide. In an embodiment, each of the first and second conductive layers 32 and 34 comprises metal silicide, such as nickel silicide, which form Ohmic contacts with the source region 22 and the second semiconductor layer 16, respectively. The third conductive layer 36 comprises metal, such as Al. The stepped gate 18 comprises polysilicon with a high doping concentration, such as heavily doped n-type polysilicon.

Figure 1E:
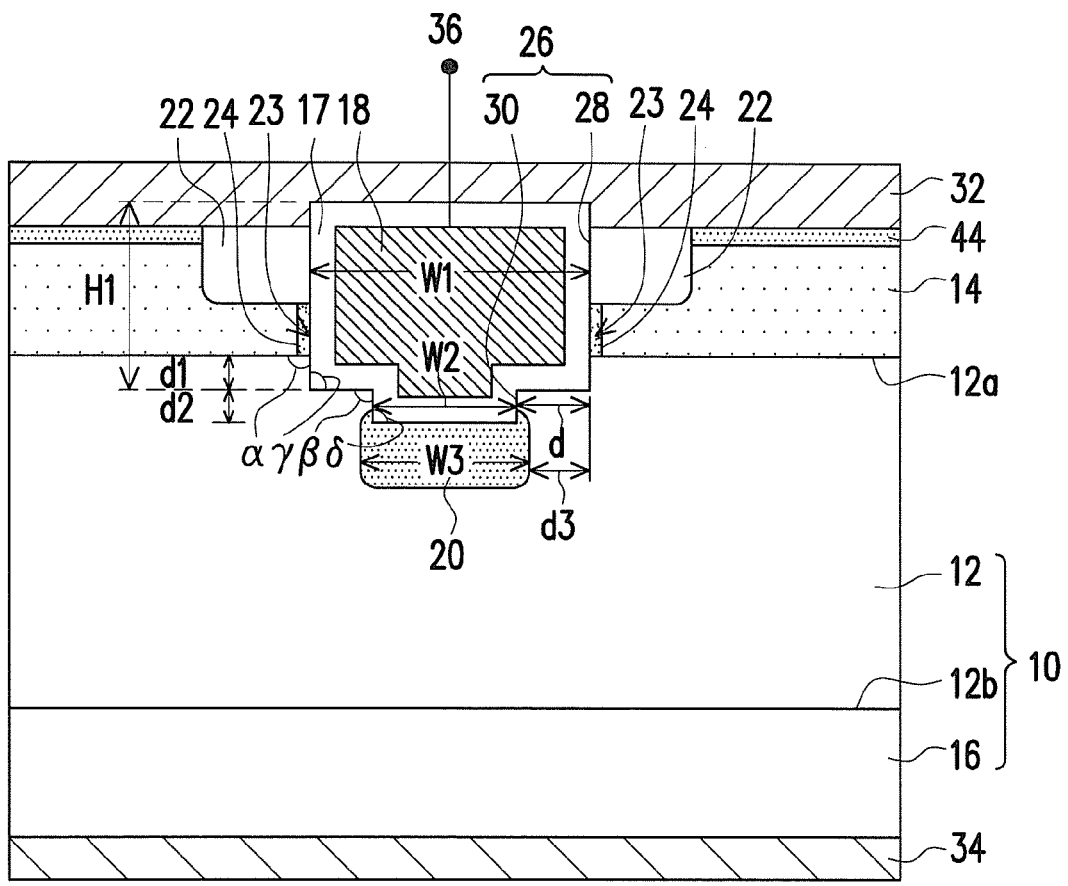

Referring to FIG. 1E, the stepped trench MOSFET can further comprise a second doped region 24 of the first conductivity type. In this embodiment, the second doped region 24 can be an n-type. The second doped region 24 is disposed in the first semiconductor region 14 at the sidewall of the first recess 28, so as to reduce or adjust the on-state resistance of the channel 23.

In the disclosure, the n-type means the doped n-type semiconductor, wherein the dopant comprises periodical table group VA ions, such as nitrogen, arsenic or phosphorous ions. The p-type means the doped p-type semiconductor, wherein the dopant comprises periodical table Group IIIA ions, such as boron or aluminium ions.

FIG. 2A to FIG. 2E are cross-sectional views of a method of fabricating a stepped trench MOSFET according to an exemplary embodiment.

Figure 2A:
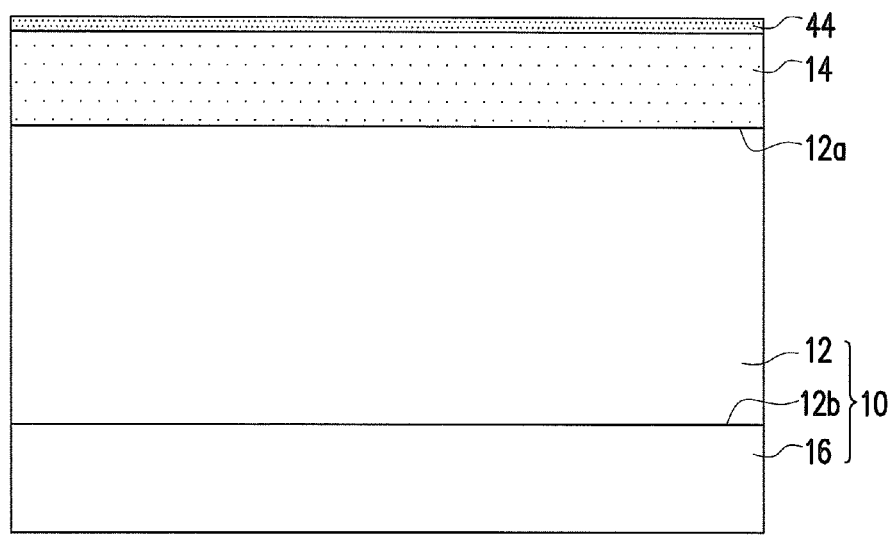
FIG. 2A to FIG. 2E are cross-sectional views of a method of fabricating a stepped trench MOSFET according to an exemplary embodiment.

Referring to FIG. 2A, a substrate 10 of a first conductivity type is provided, and a portion of the substrate 10 serves as a second semiconductor region 16. The substrate 10 comprises a semiconductor or a compound semiconductor. In this embodiment, the second semiconductor region 16 comprises n+SiC, and the thickness thereof is 350 μm, for example. A polishing step can be performed to the second semiconductor region 16 to a thickness of about 50 μm for reducing the turn on resistance Rds(on). A drift layer 12 of the first conductivity type can be a doped region formed in the substrate 10. In this embodiment, the drift layer 12 can be formed on the second semiconductor region 16 through an epitaxy method. The thickness of the drift layer 12 depends on the applications and can be varying from 1 μm to 100 μm. Thereafter, a first semiconductor region 14 of a second conductivity type is formed on the drift layer 12 through epitaxy or implantation methods. Afterwards, a first doped region 44 having a second conductivity type and a high doping concentration can be formed at the surface of the first semiconductor region 14 through an ion implantation method for creating a good body contact.

Figure 2B:
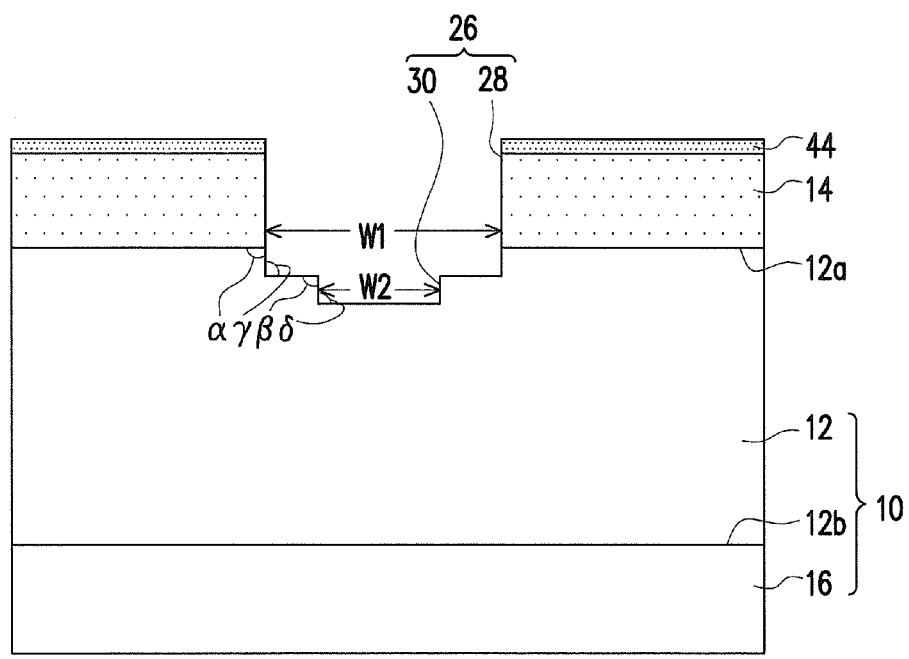

Referring to FIG. 2B, a stepped gate trench 26 is then formed in the drift layer 12 and in the first semiconductor region 14. The stepped gate trench 26 at least comprises a first recess 28 and a second recess 30. The stepped gate trench 26 can be formed through any known method. For example, the first recess 28 can be formed before or after the formation of the second recess 30. In an embodiment, a composite hard mask comprising a nickel layer and a silicon oxide layer is formed on the first semiconductor region 14, and a photolithography/etching process is performed to transfer patterns to the composite hard mask. Thereafter, the second recess 30 with a predetermined depth is formed with a $SF_6$-containing etching gas. Then an appropriate gas with that the etching rate of silicon oxide is greater than that of nickel (e.g. a $CF_4$-containing gas) is used to form an opening with the required width for the first recess 28 in the silicon oxide layer of the composite hard mask by a self-aligned method. Another gas (e.g. a $CO/NH_4$ mixture gas) is used to remove the nickel hard mask layer exposed by the opening of the silicon oxide layer. Then, the first recess 28 and the second recess 30 with their target depths are formed with a $SF_6$-containing etching gas. In another embodiment, the first recess 28 is formed through a photolithography/etching process, and the second recess 30 is formed below the bottom of the first recess 28 through another photolithography/etching process. In yet another embodiment, a narrower recess is formed in the first semiconductor region 14 and in the drift layer 12 through a photolithography/etching process, and the first recess 28 is formed through another photolithography/etching process, wherein the final narrower recess below the first recess 28 serves as the second recess 30.

Figure 2C:
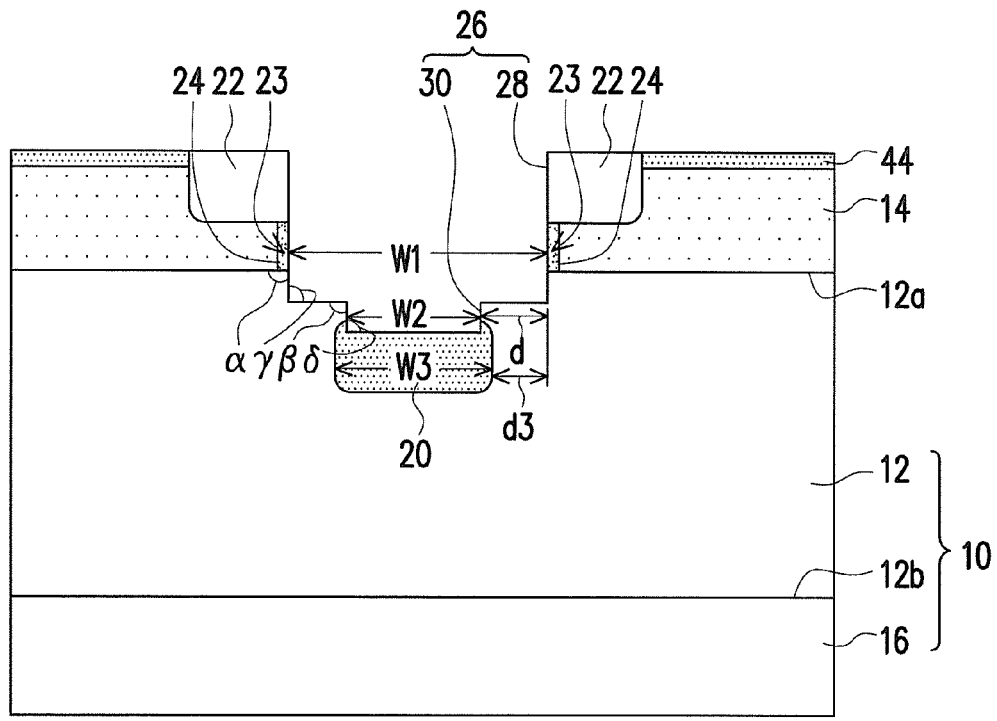

Referring to FIG. 2C, several ion implantation processes (e.g. first and second ion implantation processes) are implemented. A source region 22 of the first conductivity type is formed in the first semiconductor region 14 at the sidewall of the stepped gate trench 26 with a first ion implantation process. When a gate voltage Vds is greater than a threshold voltage Vth, a channel 23 is formed in the first semiconductor region 14, along the sidewall of the stepped gate trench 26 and between the source region 22 and the drift layer 12. A floating region 20 of the second conductivity type is formed in the drift layer 12 below the bottom of the second recess 30 with a second ion implantation process. In another embodiment, a second doped region 24 of the first conductivity type is formed in the first semiconductor region 14 at the sidewall of the first recess 28 with a third ion implantation process. Alternatively, the second doped region 24 can be formed on the first semiconductor region 14 at the sidewall of the first recess 28 with an epitaxy process. The sequences of the first ion implantation process, the second ion implantation process, and the third ion implantation process or epitaxy process can be adjusted upon the actual requirements.

Figure 2D:
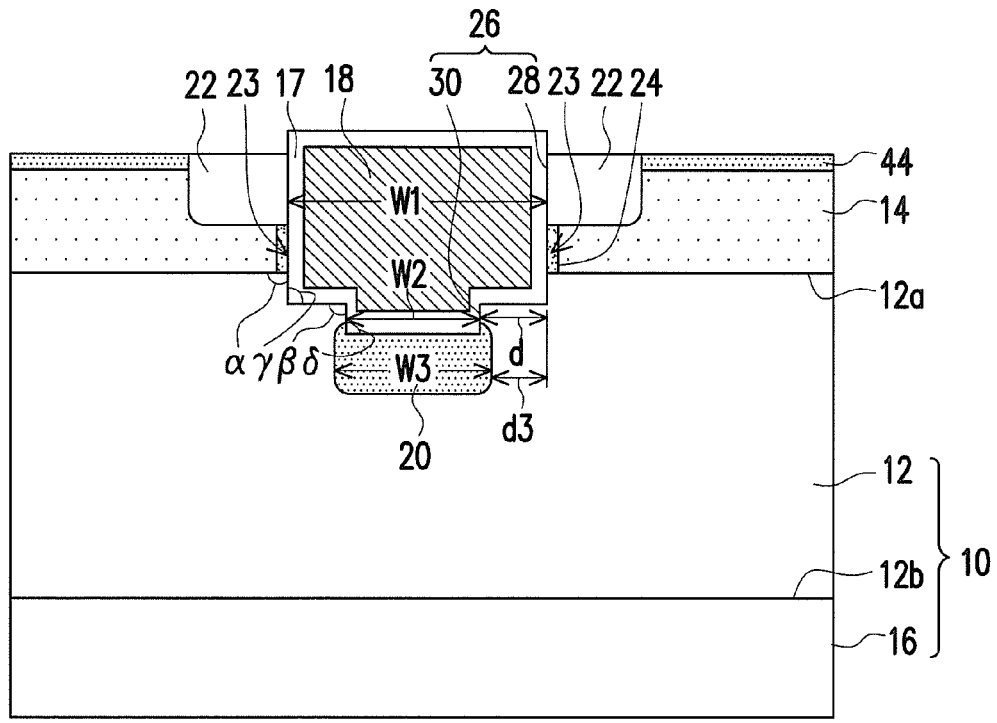

Referring to FIG. 2D, an insulation layer 17 is formed in the stepped gate trench 26 to insulate the subsequently formed stepped gate 18 from each of the first semiconductor region 14, the drift layer 12 and the floating region 20. The insulation layer 17 can be formed through thermal oxidation or chemical vapour deposition (CVD). An appropriate cleaning or sacrificial oxidation process can be formed prior to the formation of the insulation layer 17 to improve the interface between the insulation layer 17 and the semiconductor. After the formation of the insulation layer 17, an appropriate annealing process can be performed to improve the interface trap density of the insulation layer 17. Thereafter, a stepped gate 18 is formed in the stepped gate trench 26 through physical vapour deposition (PVD) or CVD. Afterwards, an etching back or planarization process is performed to remove the stepped gate material outside of the stepped gate trench 26.

Figure 2E:
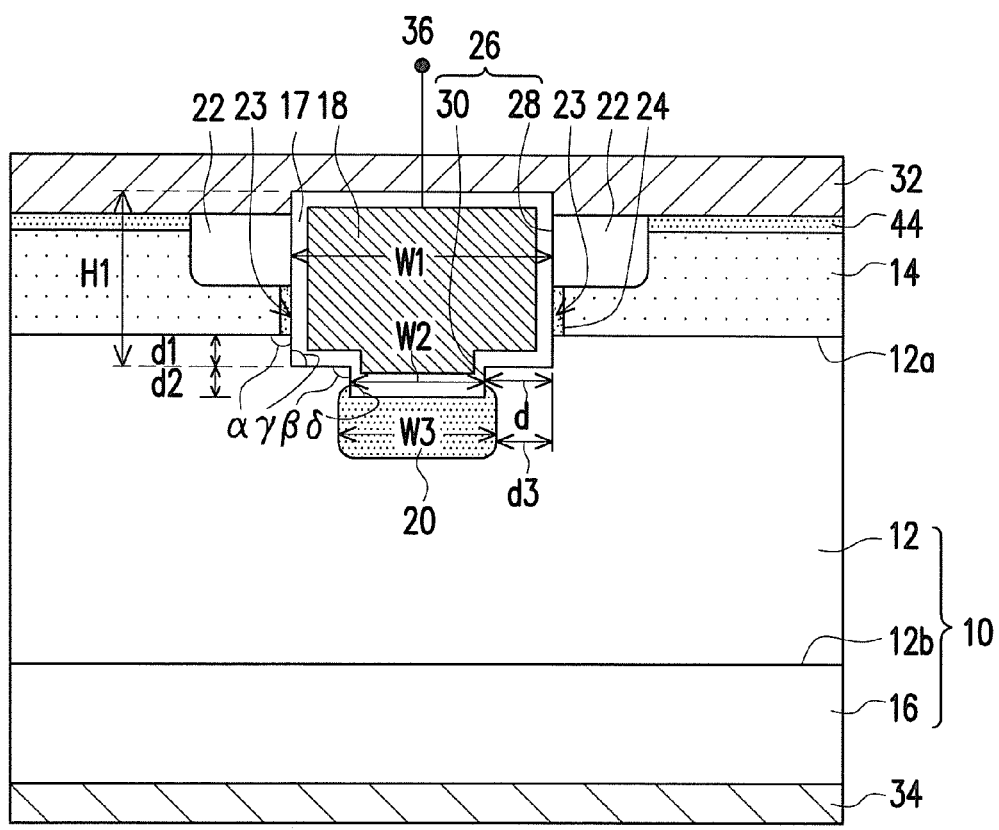

Referring to FIG. 2E, a first conductive layer 32 is foiled on the drift layer 12. A second conductive layer 34 is formed on the surface of the second semiconductor region 16. A third conductive layer 36 electrically connected to the stepped gate 18 is formed.

Figure 3:
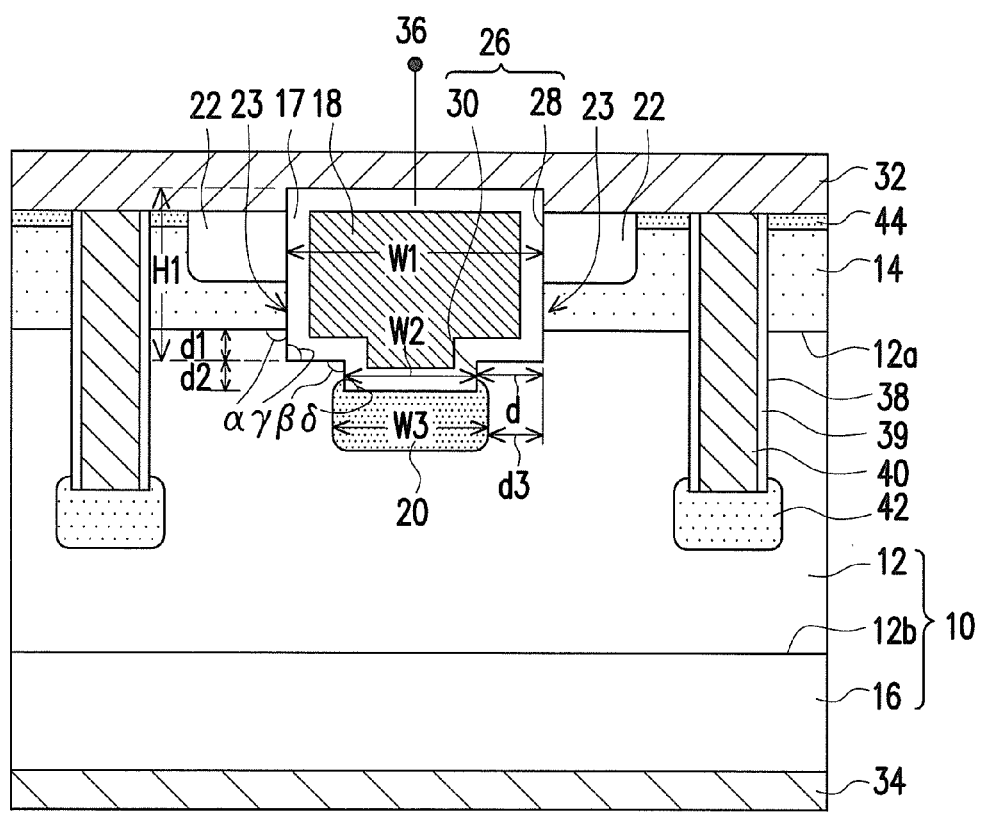
FIG. 3 is a cross-sectional view of a stepped trench MOSFET according to another exemplary embodiment.

FIG. 3 is a cross-sectional view of a stepped trench MOSFET according to another exemplary embodiment.

Referring to FIG. 3, in addition to the drift layer 12, the first semiconductor region 14, the second semiconductor region 16, the stepped gate 18, the insulation layer 17, the floating region 20, the source region 22, the first conductive layer 32, the second conductive layer 34 and the third conductive layer 36 described above, the stepped trench MOSFET of this embodiment further comprises a source trench 38, a conductive material 40 disposed in the source trench 38 and a third doped region disposed below the bottom of the source trench 38. The source trench 38 is disposed approximate to the source region 22, extends from the surface of the first semiconductor region 14 into the drift layer 12, and is deeper than the stepped gate trench 26. The conductive material 40 is electrically connected to the second conductive layer 34. The conductive material 40 comprises metal, alloy, doped polysilicon, metal silicide or a combination thereof. The third doped region 42 has the second conductivity type. In this embodiment, the third doped region 42 is p-type with a doping concentration of greater than $1 \times 10^{17}$ $cm^{-3}$.

The stepped trench MOSFET of FIG. 3 can be fabricated in accordance with the method described in FIG. 2A to FIG. 2E. However, before the formation of the first conductive layer 32, the source trench 38 is further formed at the location proximate to the source region 22. The source trench 38 extends from the surface of the first semiconductor region 14 into the drift layer 12, and is deeper than the stepped gate trench 26. The third doped region 42 of the second conductivity type is formed below the bottom of the source trench 38. The conductive material 40 is formed in the source trench 38. Besides, an insulation material 39 is formed on the sidewall of the source trench 38 to insulate the conductive material 40 from each of the drift layer 12 and the first semiconductor region 14. The source trench 38 can be formed through a photolithography/etching process. The third doped region 42 can be formed through an ion implantation process. The insulation material 39 can be formed by depositing an insulation material layer and then performing an etching back process thereto. The insulation material 39 comprises silicon oxide. The conductive material 40 can be formed by depositing a conductive material layer with CVD and then performing an etching back process to remove the conductive material layer outside of the source trench 38. The conductive material 40 includes p-type polysilicon or tungsten.

Embodiment 1

Provided is a silicon carbide substrate doped with nitrogen and having a doping concentration of $1 \times 10^{20}$ cm$^{-3}$. The substrate is an n+ semiconductor region having a thickness of 350 μm. Thereafter, a drift layer having a thickness of 11 μm and a doping concentration of $6 \times 10^{15}$ cm$^{-3}$ is formed on the substrate. Afterwards, a 1.6 μm p-type body region doped with aluminum and having a doping concentration of $5 \times 10^{18}$ cm$^{-3}$ is formed on the drift layer. A p+ doped region having a doping concentration of $1 \times 10^{19}$ cm$^{-3}$ is then formed by aluminum ion implantation. Further, a stepped gate trench comprising a first recess (1.8 μm deep and 2 μm wide) and a second recess (2 μm deep measuring from the surface of the p-type body region to the bottom of the second recess; 1.5 μm wide measuring at the location below the bottom of the first recess) is formed. Thereafter, an n+ source region doped with nitrogen or phosphor and having a doping concentration of $1 \times 10^{19}$ cm$^{-3}$ is formed. Afterwards, a floating region doped with aluminum and having a doping concentration of $3 \times 10^{18}$ cm$^{-3}$ and a depth of 0.5 μm is formed below the second recess. Further, a gate oxide layer (or a gate dielectric layer) is formed in the stepped gate trench with a thickness of 50 nm. A stepped gate using in-situ doped polysilicon is then formed. Next, a nickel silicide is formed as the source contact metal layer, providing Ohmic contact between the source contact metal layer and the source region. A nickel silicide is also formed as the drain contact metal layer to provide Ohmic contact between the drain contact metal layer and the backside of the substrate. A 100 nm TiW is, for example, used to form good contact with the stepped gate. A 4 μm aluminum is formed on the source contact metal layer as the top metal (not shown).

Embodiment 2

Referring to FIG. 1D, the stepped trench MOSFET of Embodiment 2 is similar to that of Embodiment 1, except that the gate oxide layer in the stepped gate trench of Embodiment 2 has a varied thickness. In the stepped trench MOSFET of Embodiment 2, the silicon oxide layer in the first recess has a thickness of 50 nm on the sidewall and a thickness of 100 nm on the bottom. The gate oxide layer in the second recess has a thickness of 200 nm. The forming method of the oxide layer of Embodiment 2 is described below. A 100 nm oxide layer is uniformly deposited in the trench. A photoresist is filled in the trench. The photoresist in the first recess is removed. The silicon oxide layer on the sidewall and bottom of the first recess is etched. The photoresist in the second recess is removed. The above steps are repeated to deposit another 100 nm oxide layer in the trench and a portion of the another oxide layer on the sidewall of the first recess is removed. Alternatively, a selective deposition process is used instead. A deposition blocking layer is formed in the trench. The deposition blocking layer on the bottom of the trench is removed. An oxide layer is then formed through CVD, and the oxide layer has different thicknesses at different locations because the oxide layer on the sidewall has a lower deposition rate due to the presence of the deposition blocking layer.

Embodiment 3

Referring to FIG. 1A, the stepped trench MOSFET of Embodiment 3 is similar to that of Embodiment 1, except that the floating region of Embodiment 3 at least covers the bottom and a portion of the sidewall of the second recess.

Embodiment 4

Referring to FIG. 1C, the stepped trench MOSFET of Embodiment 4 is similar to that of Embodiment 1, except that in Embodiment 4, the bottom corners of the first and second recesses and the junction between the first and second recesses are rounded.

Embodiment 5

Referring to FIG. 1E, the stepped trench MOSFET of Embodiment 5 is similar to that of Embodiment 1, except that in Embodiment 5, additional nitrogen ions are implanted to the sidewall of the first recess after the formation of the stepped gate trench, so as to form an n-type region (i.e. second doped region) having a thickness of 0.1 μm and a doping concentration of $1 \times 10^{16}$ cm$^{-3}$.

Embodiment 6

Referring to FIG. 1B, the stepped trench MOSFET of Embodiment 6 is similar to that of Embodiment 1, except that the second recess of Embodiment 6 is an opening with a wide top and a narrow bottom, wherein the upper width at the bottom of the first recess is 1.5 μm, the lower width is 0.5 μm, and the depth measuring from the surface is 2 μm.

Embodiment 7

Referring to FIG. 3, the stepped trench MOSFET of Embodiment 7 is similar to that of Embodiment 1, except that in Embodiment 7, a source trench is formed approximate to the source region, a p-type source implanted region (or a doped region) doped with aluminum and having a concentration of $1 \times 10^{18}$ cm$^{-3}$ is formed below the bottom of the source trench, and a conductive material such as p-type polysilicon or tungsten is filled in the source trench.

EXAMPLE 1 to EXAMPLE 5

Figure 4B:
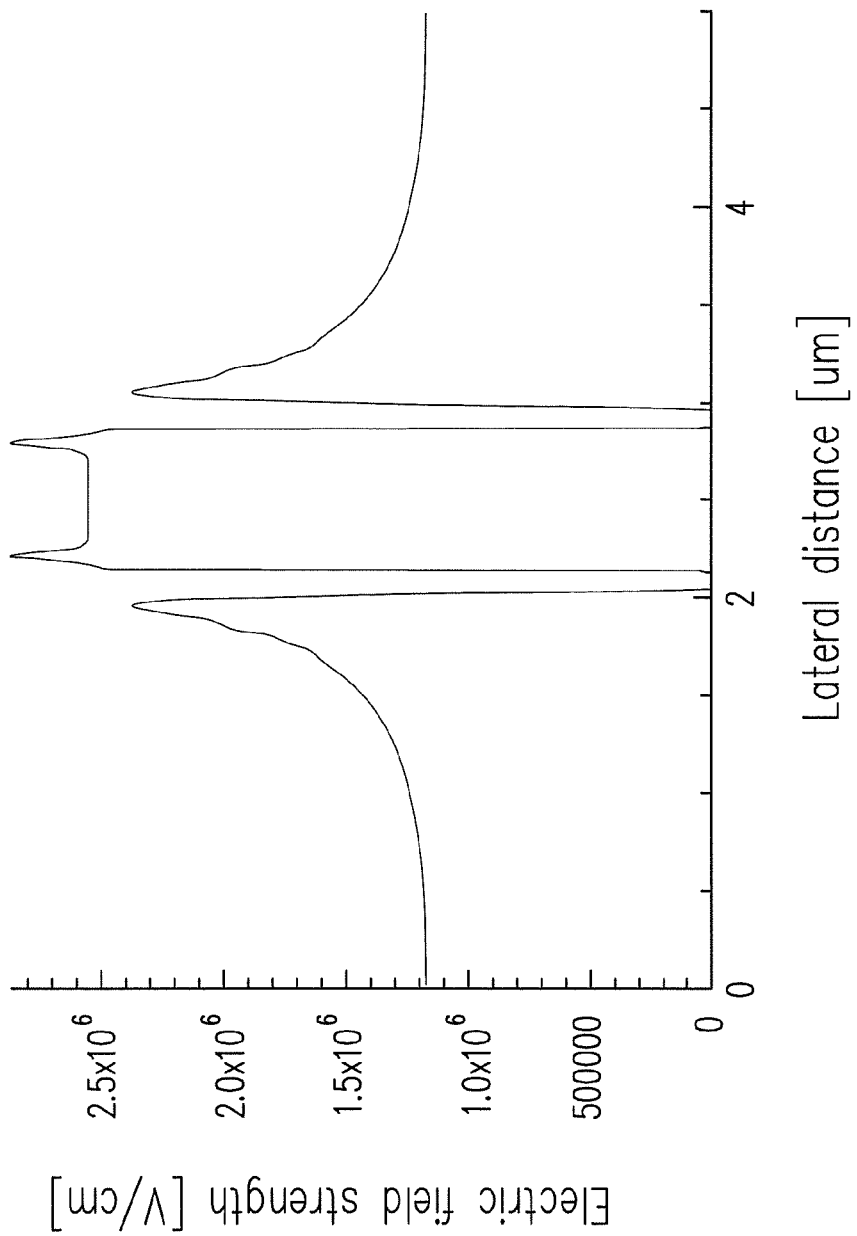
FIG. 4B is a diagram illustrating the electric field strength distribution of a stepped trench MOSFET having double recesses with a p-type floating region of Example 1 of the disclosure.
Figure 7:
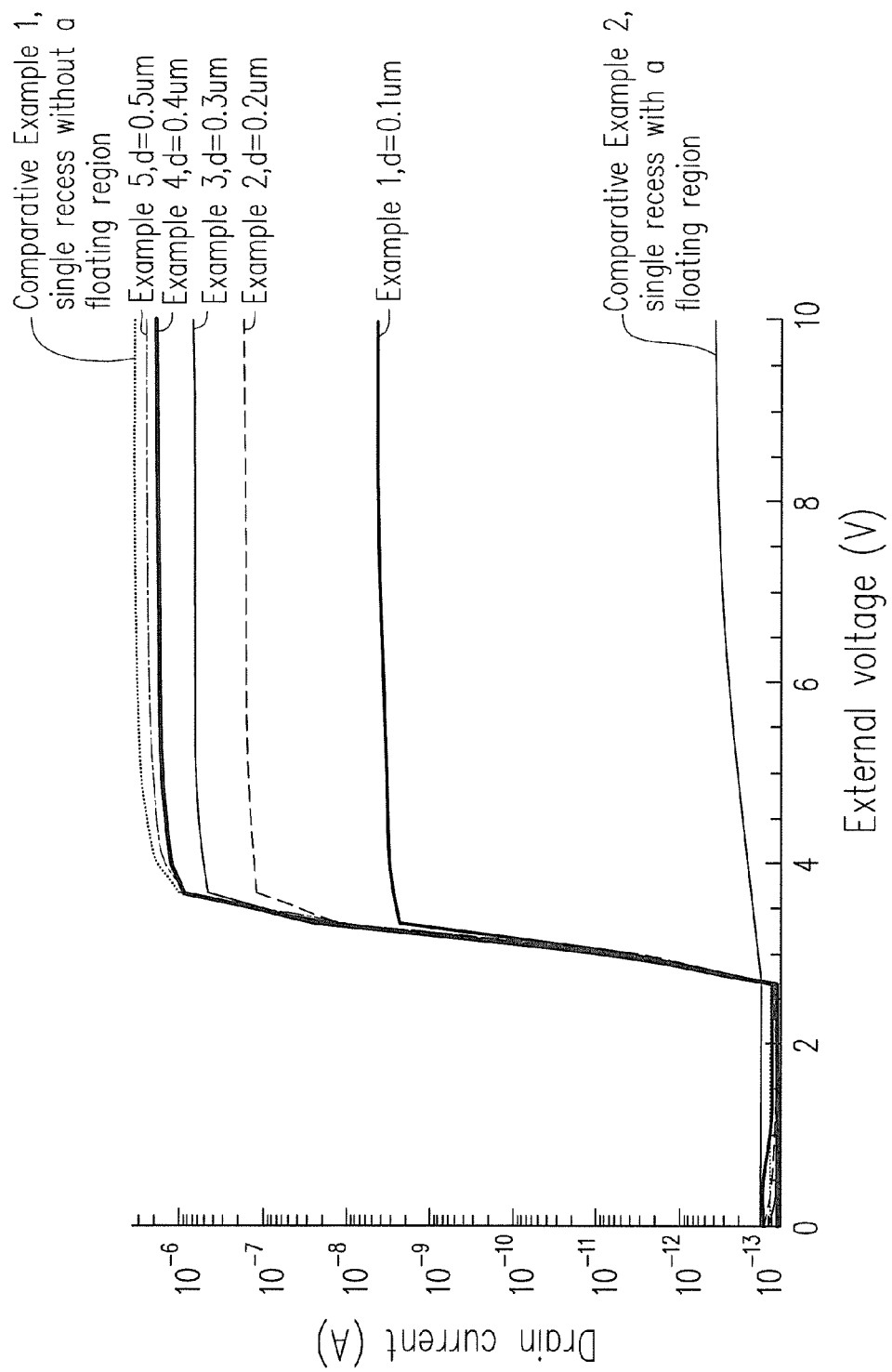
FIG. 7 illustrates I-V curves of trench MOSFETs of Example 1-5 and Comparative Example 1-2 of the disclosure.

N-type stepped trench MOSFETs each with double recesses of Example 1-5 are fabricated in accordance with the method described in Embodiment 1, wherein a p-type floating region is formed below the bottom of the second recess. In Example 1 to 5, the differences between the first recess and the second recess (d=(W1−W2)/2) are respectively 0.1 μm, 0.2 μm, 0.3 μm, 0.4 μm and 0.5 μm. The simulated electric potential contour of Example 3 device is shown in FIG. 4A. The simulated electric field strength distribution along the bottom of second recess is shown in FIG. 4B. The maximum electric fields of Example 1 to Example 5 are listed in Table 1. The I-V curves of Example 1 to Example 5 are shown in FIG. 7.

Comparative Example 1

Figure 5A:
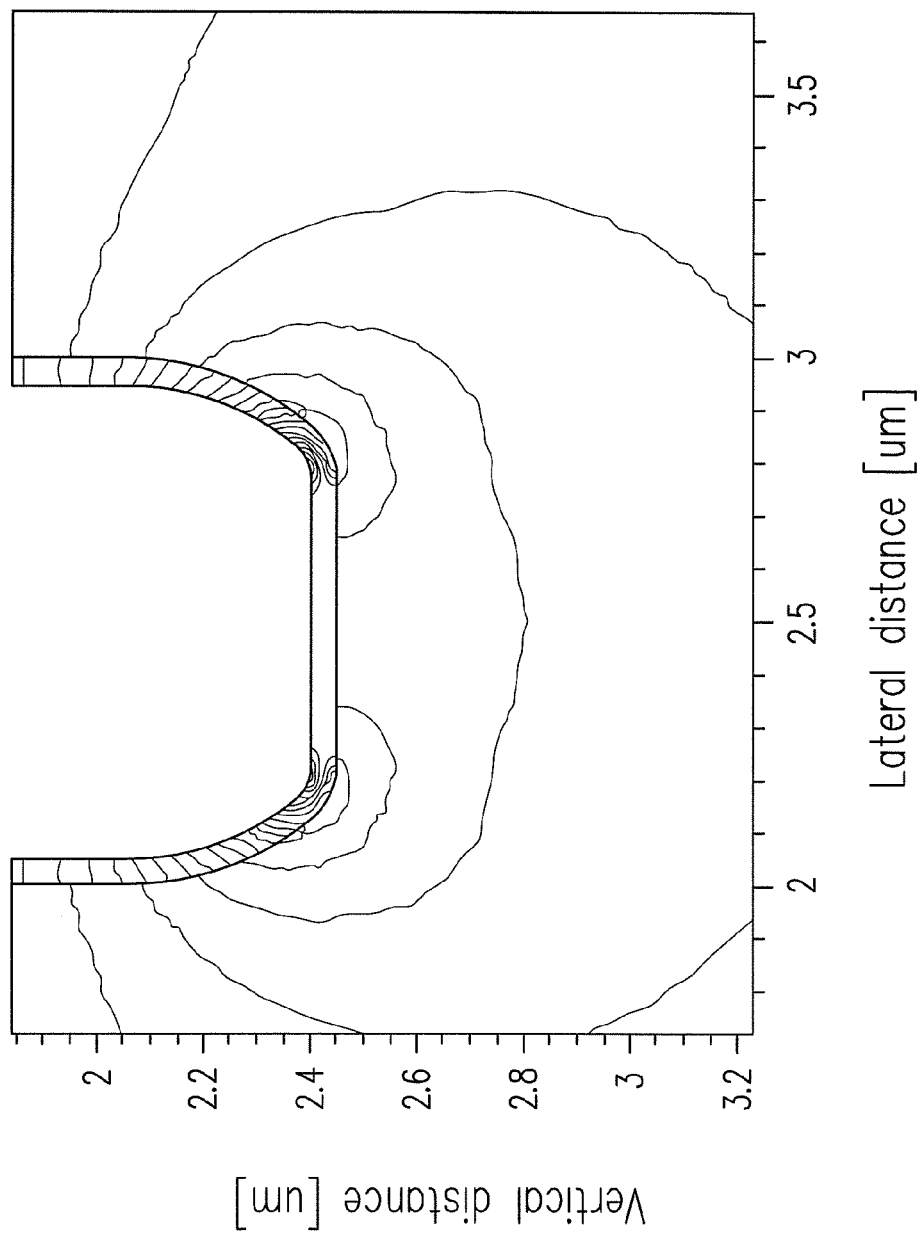
FIG. 5A is a diagram illustrating the electric field distribution of a trench MOSFET having a single recess without a p-type floating region of Comparative Example 1 of the disclosure.
Figure 5B:
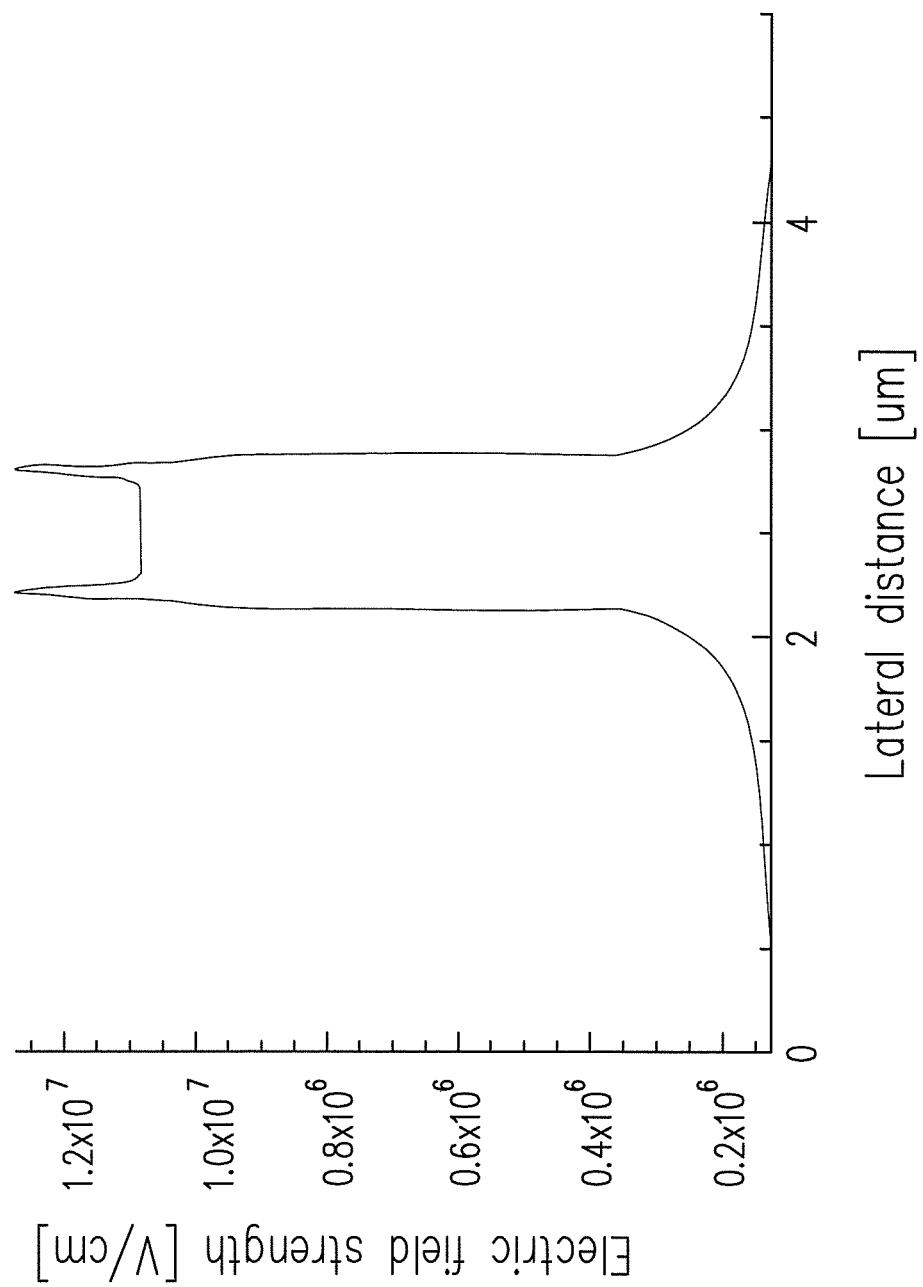
FIG. 5B is a diagram illustrating the electric field strength distribution of a trench MOSFET having a single recess without a p-type floating region of Comparative Example 1 of the disclosure.

A trench MOSFET with a single recess of Comparative Example 1 is fabricated, wherein no p-type floating region is formed below the bottom of the single recess. The simulated electric potential contour at the reverse voltage of 1,200V is shown in FIG. 5A, wherein the maximum electric field is located within the gate dielectric layer of the device. The simulated electric field distribution along the trench bottom is shown in FIG. 5B, wherein the maximum electric field strength is as high as 12.5 MV/cm. The I-V curve of Comparative Example 1 is shown in FIG. 7.

Comparative Example 2

Figure 6A:
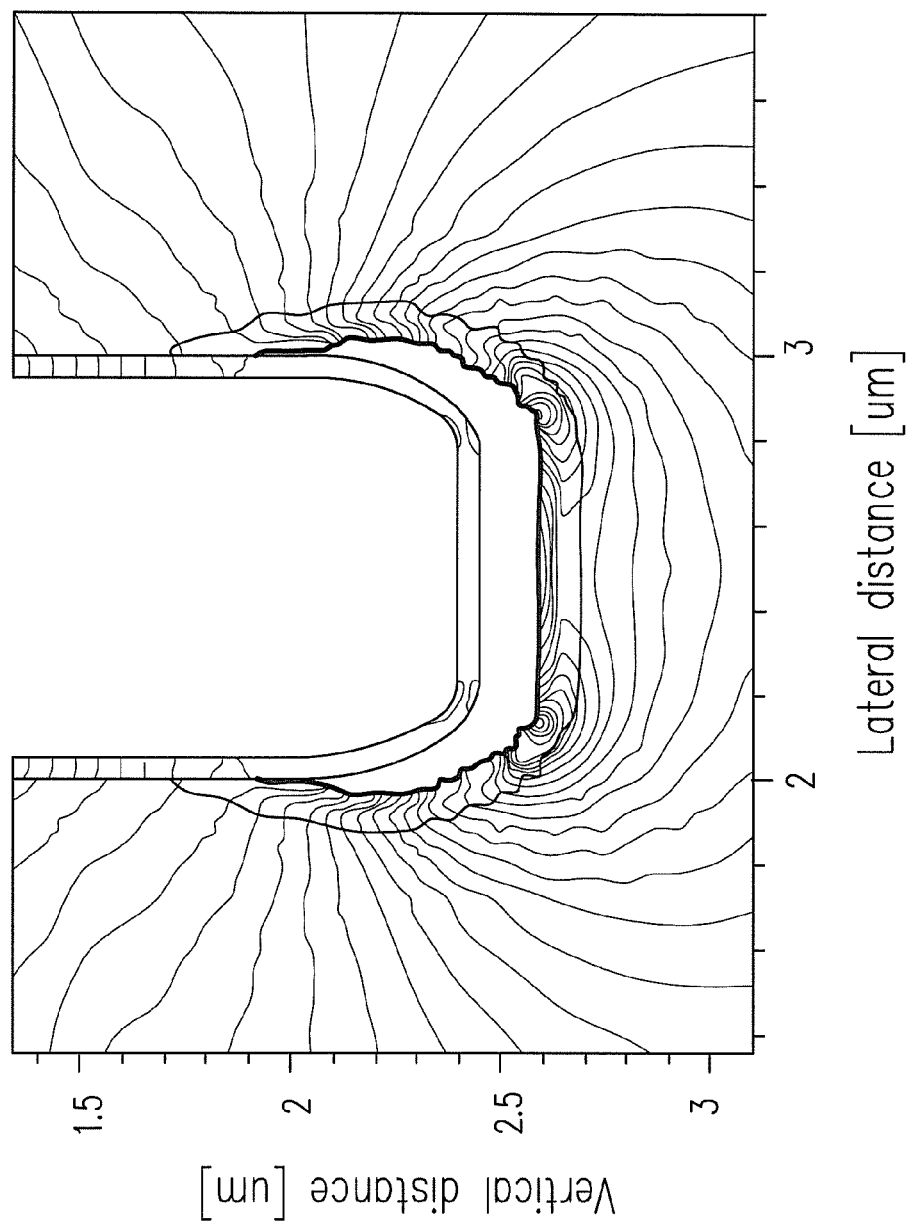
FIG. 6A is a diagram illustrating the electric field distribution of a trench MOSFET having a single recess with a p-type floating region of Comparative Example 2 of the disclosure.
Figure 6B:
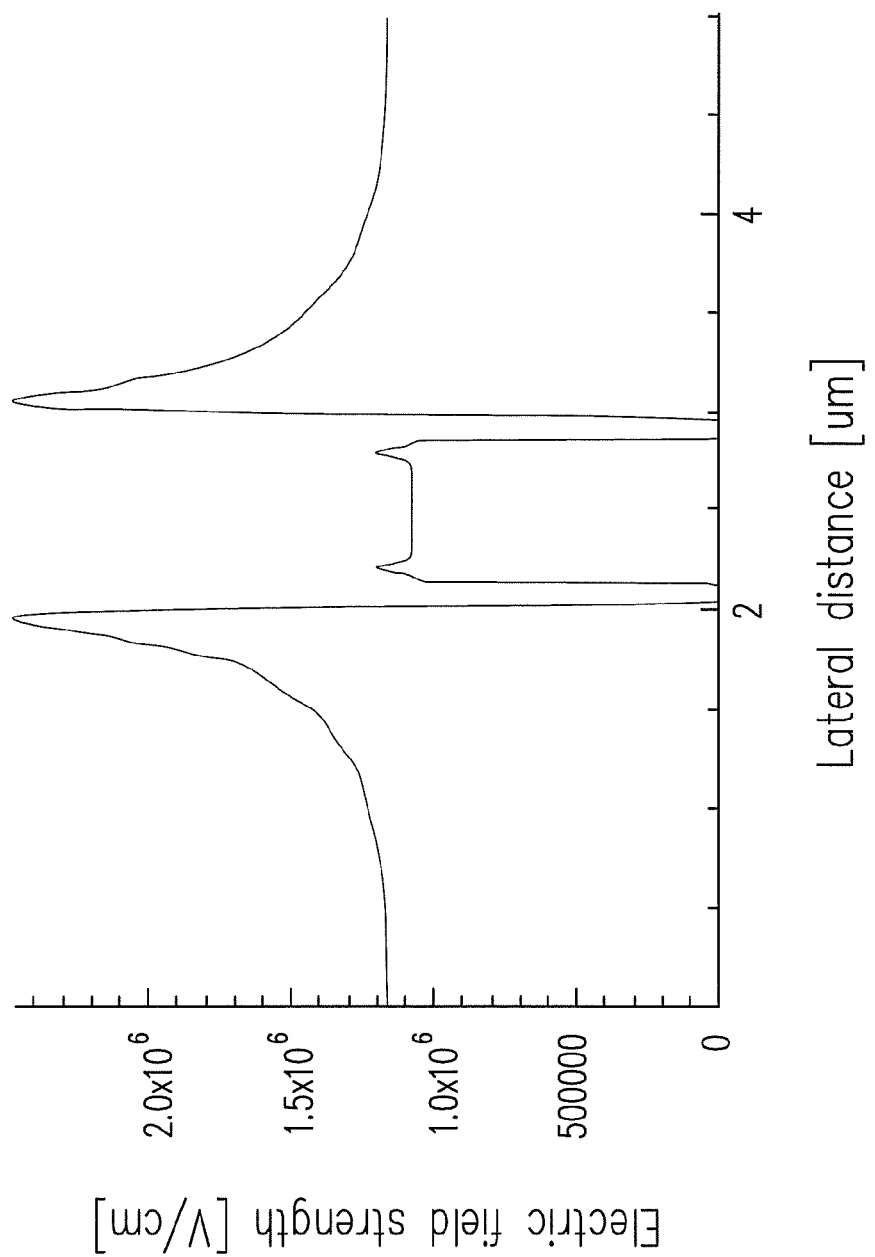
FIG. 6B is a diagram illustrating the electric field strength distribution of a trench MOSFET having a single recess with a p-type floating region of Comparative Example 2 of the disclosure.

A trench MOSFET with a single recess of Comparative Example 2 is fabricated, wherein a p-type floating region is formed below the bottom of the single recess. The simulated electric potential contour at the reverse voltage of 1,200V is shown in FIG. 6A where the maximum electric field of the device is reduced to 4.4 MV/cm and is at the pn junction between the p-type floating region and the n-type drift layer. The simulated electric field distribution along the trench bottom is shown in FIG. 6B, wherein and the maximum electric field strength within the gate dielectric layer is reduced to 2.9 MV/cm. The I-V curve of Comparative Example 2 is shown in FIG. 7.

TABLE 1

|  | Width difference between first and second recesses ($d = (W1 - W2)/2$, μm) | P-type floating region | Maximum electric field in device (MV/cm) |
| --- | --- | --- | --- |
| Example 1 | 0.1 | Yes | 4.4 |
| Example 2 | 0.2 | Yes | 4.3 |
| Example 3 | 0.3 | Yes | 4.3 |
| Example 4 | 0.4 | Yes | 6.6 |
| Example 5 | 0.5 | Yes | 6.5 |
| Comparative Example 1 | 0.0 | No | 12.5 |
| Comparative Example 2 | 0.0 | Yes | 4.4 |

From the results of FIG. 5A, FIG. 5B, FIG. 7 and Table 1, the electric field is apparently concentrated at the bottom corner of the trench during the reverse operation of the device. The electric field within the gate dielectric layer is as high as 12.5 MV/cm at the reverse voltage of 1,200 V.

From the results of FIG. 6A, FIG. 6B, FIG. 7 and Table 1, when a p-type floating region is formed below the bottom of the trench, the electric field within the gate dielectric layer can be reduced to below 3 MV/cm due to the electric field shielding effect of the pn junction. However, the p-type floating region would have a significant adverse effect on the forward current.

From the results of FIG. 4A, FIG. 4B, FIG. 7 and Table 1, when a stepped gate trench is used, the electric field within the gate dielectric layer can be shielded and the adverse effect of floating region on the forward current can be reduced. The maximum electric field within the device is reduced to 4.3 MV/cm at the pn junction between the p-type floating region and the n-type drift layer, and the maximum electric field within the gate dielectric layer is reduced to below 3 MV/cm, so the gate dielectric layer at the bottom corner of the stepped gate trench is effectively protected.

From the results of FIG. 4A, FIG. 5A, FIG. 6A and Table 1, when a p-type floating region is formed below the bottom of the single recess/second recess, a depletion region formed by the pn junction can be used to shield the electric field on the gate dielectric layer. Therefore, at the reverse voltage of 1,200 V, the maximum electric field within the device is reduced from 12.5 MV/cm to 4.3 MV/cm. Moreover, from the results of FIG. 4B, FIG. 5B and FIG. 6B, the p-type floating region formed below the bottom of the single recess/second recess can reduce the electric field at the bottom corner of the single recess/second recess. Accordingly, the damage to the gate dielectric layer can be decreased, and the reliability of the device can be enhanced.

As shown in FIG. 7, the turn on resistance Rds(on) of the stepped trench MOSFET is related to the width difference between the first and second recesses ($d=(W1-W2)/2$). When the width difference between the first and second recesses is greater, the turn on resistance Rds(on) is closer to the ideal value of which is not affected by the floating region below the bottom of the recess. The width difference between the first and second recesses can be optimized upon the actual application and device specification.

In summary, in the stepped trench MOSFET of the disclosure, a gate is formed in the stepped gate trench with different widths of recesses, and a floating region is formed below the bottom of the smaller recess. The floating region is formed below the second recess which is smaller than the first recess, so that a depletion region formed because of the pn junction can be used to shield the electric field of the gate dielectric layer and increase the device reliability during the reverse operation. In addition, the width of first recess is greater than that of the second recess, and the floating region does not extend to the region below the channel, so that the floating region below the bottom of the smaller recess reduces its adverse effect on the turn on resistance Rds(on) during the forward operation.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A stepped trench MOSFET, comprising:
a drift layer of a first conductivity type;
a first semiconductor region of a second conductivity type, disposed on a first surface of the drift layer, wherein a stepped gate trench is disposed in the drift layer and in the first semiconductor region, the stepped gate trench at least comprises a first recess and a second recess, the first recess is located in the first semiconductor region and extends into the drift layer, the second recess is located in the drift layer below a bottom of the first recess, and a width of the second recess is smaller than a width of the first recess;
a second semiconductor region of the first conductivity type, disposed on a second surface of the drift layer;
a stepped gate, disposed in the stepped gate trench;
a floating region of the second conductivity type, disposed in the drift layer below a bottom of the second recess;
an insulation layer, disposed in the stepped gate trench and insulating the stepped gate from each of the first semiconductor region, the drift layer and the floating region; and
a source region of the first conductivity type, disposed in the first semiconductor region adjacent to a sidewall of the stepped gate trench, wherein a current conducting channel is formed in the first semiconductor region when a gate voltage (Vds) greater than a threshold voltage (Vth) is applied, along the sidewall of the stepped gate trench and between the source region and the drift layer.

2. The stepped trench MOSFET of claim 1, wherein the insulation layer on the bottom of the first recess is thicker than the insulation layer on a sidewall of the first recess, and the insulation layer in the second recess is thicker than or as thick as the insulation layer on the bottom of the first recess.

3. The stepped trench MOSFET of claim 1, wherein the second recess is an opening with a wide top and a narrow bottom.

4. The stepped trench MOSFET of claim 1, further comprising a first doped region of the second conductivity type, extending from a surface of the first semiconductor region into the first semiconductor region.

5. The stepped trench MOSFET of claim 1, further comprising a second doped region of the first conductivity type disposed in the first semiconductor region at a sidewall of the first recess.

6. The stepped trench MOSFET of claim 1, further comprising:
  a first conductive layer, disposed on the first semiconductor region and electrically connected to the source region; and
  a second conductive layer, disposed on a surface of the second semiconductor region, wherein the second semiconductor region is located between the drift layer and the second conductive layer.

7. The stepped trench MOSFET of claim 1, wherein the floating region further extends to a portion of a sidewall of the second recess so as to cover a bottom corner of the second recess.

8. The stepped trench MOSFET of claim 1, further comprising:
  a source trench, disposed proximate to the source region, extending from a surface of the first semiconductor region into the drift layer, and being deeper than the stepped gate trench;
  a conductive material, disposed in the source trench;
  an insulation material, disposed between a sidewall of the source trench and the conductive material; and
  a third doped region of the second conductivity type, disposed below a bottom of the source trench.

9. The stepped trench MOSFET of claim 1, wherein a bottom corner of the first recess is rounded.

10. The stepped trench MOSFET of claim 1, wherein a bottom corner of the second recess is rounded.

11. A method of fabricating a stepped trench MOSFET, comprising:
  forming a first semiconductor region of a second conductivity type on a drift layer of a first conductivity type, wherein the drift layer is disposed on a second semiconductor region of the first conductivity type;
  forming a stepped gate trench in the drift layer and in the first semiconductor region, wherein the stepped gate trench at least comprises a first recess and a second recess, the first recess is located in the first semiconductor region and extends into the drift layer, the second recess is located in the drift layer below a bottom of the first recess, and a width of the second recess is smaller than a width of the first recess;
  forming a source region of the first conductivity type in the first semiconductor region at a sidewall of the stepped gate trench, wherein a current conducting channel is formed in the first semiconductor region when a gate voltage greater than a threshold voltage is applied, along a sidewall of the stepped gate trench and between the source region and the drift layer;
  forming a floating region of the second conductivity type in the drift layer below a bottom of the second recess;
  forming an insulation layer in the stepped gate trench; and
  forming a stepped gate in the stepped gate trench, wherein the insulation layer insulates the stepped gate from each of the first semiconductor region, the drift layer and the floating region.

12. The method of claim 11, further comprising forming a first doped region of the second conductivity type, wherein the first doped region extends from a surface of the first semiconductor region into the first semiconductor region.

13. The method of claim 11, further comprising forming a second doped region of the first conductivity type in the first semiconductor region at a sidewall of the first recess.

14. The method of claim 11, further comprising:
  forming a first conductive layer on the first semiconductor region, wherein the first conductive layer is electrically connected to the source region; and
  forming a second conductive layer on a surface of the second semiconductor region, wherein the second semiconductor region is located between the drift layer and the second conductive layer.

15. The method of claim 11, wherein the floating region further extends to a portion of a sidewall of the second recess so as to cover a bottom corner of the second recess.

16. The method of claim 11, further comprising:
  forming a source trench proximate to the source region, wherein the source trench extends from a surface of the first semiconductor region into the drift layer, and is deeper than the stepped gate trench;
  forming a third doped region of the second conductivity type below a bottom of the source trench;
  forming an insulation material on a sidewall of the source trench; and
  forming a conductive material in the source trench.

17. The method of claim 11, further comprising rounding a bottom corner of the first recess.

18. The method of claim 11, further comprising rounding a bottom corner of the second recess.

19. The method of claim 11, wherein the insulation layer on the bottom of the first recess is thicker than the insulation layer on a sidewall of the first recess, and the insulation layer in the second recess is thicker than or as thick as the insulation layer on the bottom of the first recess.

20. The method of claim 11, wherein the second recess is an opening with a wide top and a narrow bottom.

* * * * *